US012757669B2

(12) United States Patent
Matsui et al.

(10) Patent No.: US 12,757,669 B2
(45) Date of Patent: Oct. 6, 2026

(54) PLASMA PROCESSING DEVICE AND PLASMA PROCESSING METHOD

(71) Applicant: Hitachi High-Tech Corporation, Tokyo (JP)

(72) Inventors: Miyako Matsui, Tokyo (JP); Tatehito Usui, Tokyo (JP); Kenichi Kuwahara, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/641,233

(22) PCT Filed: Dec. 16, 2020

(86) PCT No.: PCT/JP2020/046976
§ 371 (c)(1),
(2) Date: Mar. 8, 2022

(87) PCT Pub. No.: WO2022/130536
PCT Pub. Date: Jun. 23, 2022

(65) Prior Publication Data
US 2024/0047239 A1 Feb. 8, 2024

(51) Int. Cl.
*H01J 37/32* (2006.01)
*H10P 72/00* (2026.01)

(52) U.S. Cl.
CPC .... *H10P 72/0421* (2026.01); *H01J 37/32174* (2013.01); *H01J 37/32449* (2013.01); *H10P 72/0436* (2026.01); *H10P 72/0602* (2026.01)

(58) Field of Classification Search
CPC ......... H01L 21/67069; H01L 21/67115; H01L 21/67248; H01L 21/02; H01L 21/3065;
(Continued)

(56) References Cited

U.S. PATENT DOCUMENTS 5,352,324 A 10/1994 Gotoh et al.
6,355,581 B1 3/2002 Vassiliev
(Continued)

FOREIGN PATENT DOCUMENTS

JP H11111699 A 4/1999
JP 2003083720 A 3/2003
(Continued)

OTHER PUBLICATIONS

Search Report mailed Mar. 9, 2021 in International Application No. PCT/JP2021/046976.
(Continued)

*Primary Examiner* — Rudy Zervigon
(74) *Attorney, Agent, or Firm* — Miles & Stockbridge, P.C.

(57) ABSTRACT

The plasma processing device according to the present invention includes a processing chamber in which a sample is plasma processed, a radio frequency power supply which supplies radio frequency power for generating plasma, and a sample stand on which the sample is placed. The plasma processing device includes a control device which measures a thickness of a protective film selectively formed on a desired material of the sample using an interference light reflecting from the sample which has been irradiated with an ultraviolet-ray, or determines selectivity of the protective film using the interference light reflecting from the sample which has been irradiated with the ultraviolet-ray.

6 Claims, 10 Drawing Sheets

(58) Field of Classification Search

CPC ....... H01L 21/311; H01L 22/00; H01L 22/26; H01L 21/02164; H01L 21/31116; H01L 21/31144; H01L 22/12; H01L 21/67253; H01L 22/20; H01J 37/32174; H01J 37/32449; H01J 37/32972; H01J 37/32; H01J 37/32935; H01J 37/3299; H01J 37/32963; G01B 11/06; C23C 16/52; C23C 14/54

USPC ............ 118/663, 665, 668, 688; 156/345.24, 156/345.25, 345.26, 345.27, 345.28

See application file for complete search history.

(56) References Cited

U.S. PATENT DOCUMENTS

| | | | | |
|---|---|---|---|---|
| 6,824,813 | B1 * | 11/2004 | Lill | H01J 37/32935 216/60 |
| 8,124,537 | B2 | 2/2012 | Lee et al. | |
| 9,530,666 | B2 | 12/2016 | Mizuno et al. | |
| 2004/0035529 | A1 * | 2/2004 | Grimbergen | H01L 21/67253 156/345.24 |
| 2004/0087152 | A1 * | 5/2004 | Lian | G01B 11/0683 438/689 |
| 2007/0026677 | A1 | 2/2007 | Ji et al. | |
| 2007/0238305 | A1 | 10/2007 | Delgadino et al. | |
| 2008/0020584 | A1 | 1/2008 | Hirotsu et al. | |
| 2008/0176149 | A1 * | 7/2008 | Grimbergen | C23F 4/00 216/60 |
| 2011/0139748 | A1 | 6/2011 | Donnelly et al. | |
| 2013/0023125 | A1 | 1/2013 | Singh | |
| 2015/0235861 | A1 | 8/2015 | Mizuno et al. | |
| 2016/0099187 | A1 | 4/2016 | Lian | |
| 2016/0181134 | A1 * | 6/2016 | Budiarto | H01L 21/0332 118/712 |
| 2016/0379841 | A1 | 12/2016 | Hidaka et al. | |
| 2018/0233350 | A1 | 8/2018 | Tois et al. | |
| 2018/0269118 | A1 | 9/2018 | Matsui et al. | |
| 2019/0019689 | A1 | 1/2019 | Kihara et al. | |
| 2020/0043710 | A1 * | 2/2020 | Meng | H01L 21/67253 |
| 2020/0335354 | A1 | 10/2020 | Matsui et al. | |

FOREIGN PATENT DOCUMENTS

| | | | |
|---|---|---|---|
| JP | 2005294348 | A | 10/2005 |
| JP | 2007258586 | A | 10/2007 |
| JP | 2008060566 | A | 3/2008 |
| JP | 2012529777 | A | 11/2012 |
| JP | 2014232825 | A | 12/2014 |
| JP | 201711167 | A | 1/2017 |
| JP | 2017212331 | A | 11/2017 |
| JP | 2018137435 | A | 8/2018 |
| JP | 2018157048 | A | 10/2018 |
| KR | 20170000791 | A | 1/2017 |
| WO | 2014046083 | A1 | 3/2014 |
| WO | 2020121540 | A1 | 6/2020 |

OTHER PUBLICATIONS

Search Report mailed Mar. 10, 2020 in corresponding International Application No. PCT/JP2019/049420.

Written Opinion mailed Mar. 10, 2020 in corresponding International Application No. PCT/JP2019/049420.

Dominik Metzler et al "Fluorocarbon assisted atomic layer etching of SiO2 using cyclic Ar/C4F8 plasma" Journal of Vacuum Science & Technology, A32, Mar. 2014 (5 pages).

* cited by examiner

PLASMA PROCESSING DEVICE AND PLASMA PROCESSING METHOD

TECHNICAL FIELD

The present invention relates to a plasma processing device and a plasma processing method. More specifically, the present invention relates to a plasma processing device and a plasma processing method, which allow a desired etching protective film to be applied onto an upper surface of a pattern on a wafer.

BACKGROUND ART

In order to satisfy the demand for processing micronized and three-dimensionally configured functional element products such as semiconductor elements, it is essential to apply a technique for three dimensionally processing the groove and the hole using masks made of various materials such as thin film spacers and metals to the dry etching process in semiconductor manufacturing. The mask, the gate insulation film, the etch stopper, or the like for the pattern of the semiconductor device has been made thinner, demanding the processing technique for executing the shape control at an atomic layer level. Conforming to the three-dimensionally configured devices, the number of steps of processing complicated shapes has been increased.

When processing the foregoing device in the dry etching process under the pattern dimension control, the technique is used for suppressing dimensional variation by adjusting the dimension of the pattern having the protective film formed thereon into uniform. The above-described technique as disclosed in PTL 1 forms the protective film on the mask pattern before executing the dry etching process so that the dimensional variation of the mask pattern is suppressed. In the technique as disclosed in PTL 1, the temperature distribution is imparted to the inside of the wafer to allow formation of the protective film for the purpose of suppressing width dimensional variation of the initial mask pattern so that the dimensional variation in the wafer is suppressed.

PTL 2 discloses the etching technique using the protective film as the mask, which has been formed on the pattern in the etching device for the purpose of processing the desired pattern at high selectivity ratio by avoiding etching of the anti-etching material such as the mask. In PTL 2, the protective film is formed on the pattern before executing the dry etching process for uniform thickness and dimension of the protective film, and a part of the protective film is removed so that the thickness and the dimension of the thus formed protective film are made uniform in the wafer plane. The dry etching is then executed using the protective film that has been made uniform in the wafer plane as the mask.

CITATION LIST

Patent Literature

PTL 1: Japanese Patent Application Laid-Open No. 2017-212331

PTL 2: International Publication No. WO 2020/121540

SUMMARY OF INVENTION

Technical Problem

As described above, it is essential to apply the technique for controlling the processing shape of the micronized and complicated device at the atomic layer level, and processing films of various types at high selectivity ratio adapting to the micronized and complicated pattern of the three-dimensional device. In the disclosed method for executing the process as described above, before processing the pattern by the dry etching device, the protective film is formed on the pattern in the dry etching device, and the etching process is executed.

PTL 1 discloses the method for depositing the film on the mask pattern surface before etching to suppress variation in the minimum line width of the pattern. In this case, the deposition rate of the deposited film depends on the wafer temperature. Accordingly, the wafer temperature is changed in the respective areas to correct the relation between the deposition rate and the temperature, and variation in the preliminarily measured pattern dimension. The thin film is formed to correct the groove width variation so that the groove width in the wafer plane is adjusted. In order to suppress etching of the upper surface of the pattern, it is necessary to form the protective film with the thickness sufficient to prevent supply of ion energy from plasma to the interface between the protective film and the pattern surface. As FIG. 2 illustrates, in the method as disclosed in PTL 1, the deposited film 120 with substantially similar film thickness to that of the side surface 122 is formed on the upper surface 121 of the pattern 102 applied onto the substrate 103. The method allows reduction in the dimensional variation of the pattern 102. However, the method fails to adjust the thickness of the deposited film on the side surface 122, and the thickness of the upper surface 121 separately. Accordingly in the method, the film with thickness sufficient to suppress the etching as a result of ions emitted onto the upper surface 121 and radicals cannot be deposited on the upper surface 121 of the pattern 102.

PTL 2 discloses the protective film forming method which includes the protective film deposition step and the protective film part removing step. In the protective film deposition step, the protective film wider than the upper part of the pattern is formed thereon without depositing the film on the groove bottom of the pattern. The protective film part removing step removes the excessive deposited film at the wafer center in the wafer in-plane distribution of the deposited film formed in the deposition step, and controls wafer in-plane uniformity, and wafer in-plane variation in the width of the protective film. In the semiconductor device manufacturing process, there may be the case that the pattern has the dense-pattern area coexisting with the no-pattern area. In the case of processing the wafer as described above, the method as disclosed in PTL 2 allows formation of the thick protective film 101 on the upper surface of the pattern 102 in the area 107 with dense patterns 102. However, the thick protective film 104 is also formed on a surface 109 of the area 108 with no pattern 102 where the etching process is inhibited. It is therefore difficult for the method to execute the etching process to both the bottom 106 of the pattern 102 and the surface 109 of the area 108 with no pattern 102 simultaneously. FIG. 3 illustrates the state where the thin protective film 105 is formed on the surface of the bottom 106 of the pattern 102.

It is an object of the present invention to provide a protective film deposition method which allows deposition of the protective film only on the desired material of the pattern for suppressing the etching process before etching without depositing unnecessary protective film on the coarse-pattern area and the no-pattern area on the wafer. It is another object of the present invention to provide a plasma processing device and a plasma processing method for etching the pattern using the protective film deposition method.

Solution to Problem

In order to solve the problem of the generally employed technique as described above, the plasma processing device according to the present invention includes a processing chamber in which a sample is plasma processed, a radio frequency power supply which supplies radio frequency power for generating plasma, and a sample stand on which the sample is placed. The plasma processing device includes a control device which measures a thickness of a protective film selectively formed on a desired material of the sample using interference light reflecting from the sample which has been irradiated with an ultraviolet-ray, or determines selectivity of the protective film using the interference light reflecting from the sample which has been irradiated with the ultraviolet-ray.

In order to solve the problem of the generally employed technique as described above, a plasma processing method according to the present invention for executing plasma etching to an etching object film by selectively forming a protective film on a desired material. The protective film is selectively formed on the desired material using gaseous silicon tetrachloride gas ($SiCl_4$), hydrogen bromide gas (HBr), and chlorine gas ($Cl_2$).

Advantageous Effects of Invention

The present invention allows selective formation of the protective film with high reproducibility on the anti-etching material (mask) constituting the pattern before etching without forming the unnecessary protective film on the no-pattern area. This makes it possible to highly accurately execute the etching process to the micronized pattern at high selectivity ratio with high reproducibility.

DESCRIPTION OF EMBODIMENTS

An embodiment of the present invention will be described in detail with reference to the drawings. In all the drawings, each component having the same function will be designated with the same code, and a repetitive explanation thereof will be omitted.

EXAMPLES

Figure 4:
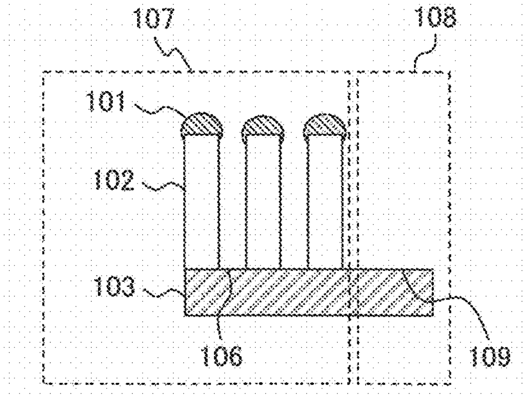
FIG. 4 is an explanatory view of a protective film forming method according to an example.

A protective film forming method according to an example will be described referring to FIG. 4. FIG. 4 is an explanatory view representing the protective film forming method according to the example. As illustrated in FIG. 4, the present invention allows formation of thick protective films 101 each on the upper surface of a pattern 102 in an area 107 with dense patterns 102, and does not allow formation of a protective film 104 on a surface 109 of an area 108 with no pattern 102. Accordingly, both a bottom 106 of each pattern 102 and the surface 109 of the area with no pattern 102 can be etched simultaneously without etching the upper surface of the pattern 102. The micronized pattern can be highly accurately etched at high selectivity ratio with high reproducibility. The area 107 with dense patterns 102 can be referred to as the dense-pattern area, or dense pattern. The area 108 with no pattern 102 can be referred to as the coarse-pattern area.

An etching device (30) according to the example is configured to selectively deposit the protective film on the desired material of the micronized pattern surface formed on a wafer (100) as a sample, and to etchedly remove the etching object film material (etching object material) as the lower layer of the pattern on which the protective film has been formed.

Figure 1:
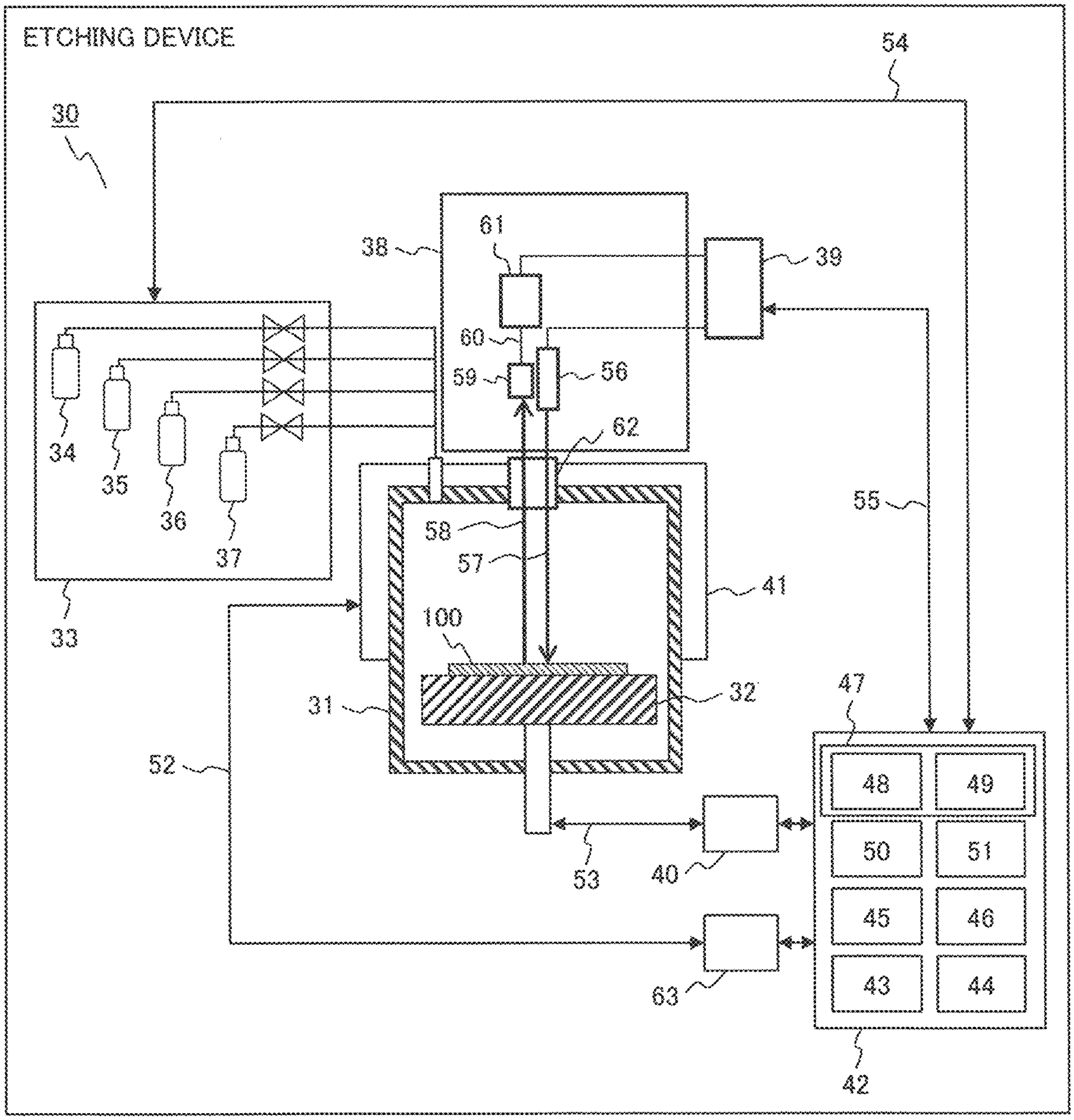
FIG. 1 is an overall view showing an example of a plasma processing device according to the present invention.
Figure 2:
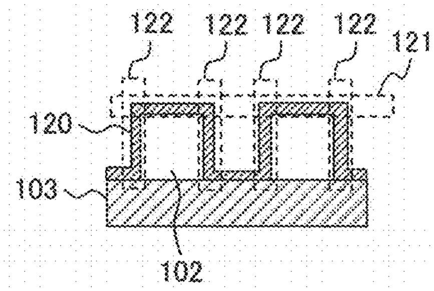
FIG. 2 is an explanatory view representing a problem of the generally employed method.
Figure 3:
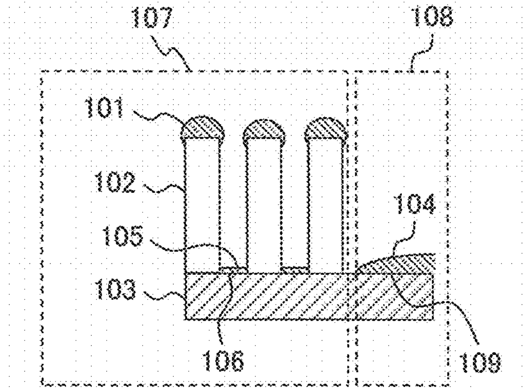
FIG. 3 is an explanatory view representing another problem of the generally employed method.

FIG. 1 illustrates an overall structure of an example of a plasma processing device according to the example. The etching device 30 as the plasma processing device includes a processing chamber 31, a wafer stage 32, a gas supply unit 33, an optical system 38, an optical system control device 39, a bias power supply 40, a radio frequency application unit 41, a device control device 42, and the like. The device control device (or control device) 42 controls the processing chamber 31, the wafer stage 32, the gas supply unit 33, the optical system 38, the optical system control device 39, the bias power supply 40, and the radio frequency application unit 41 so that operations and execution of each process step (to be described referring to FIG. 5) by the etching device 30 are controlled. The device control device 42 is constituted by functional blocks including a gas control device 43, an exhaust system control device 44, a radio frequency control device 45, a bias control device 46, a deposition process control device 47, a storage unit 50, and a clock 51. The respective functional blocks constituting the device control device 42 can be implemented by a single unit of personal computer (PC). The deposition process control device 47 constituted by a determination unit 48 and a database storage unit 49 is configured to refer to the database 49 with respect to the signal sent from the optical system control device 39, and to allow the determination unit 48 to determine formation of the protective film only on the desired material. The wafer stage 32 is a loading stand or a sample stand, on which the wafer 100 as the sample is placed. When executing the plasma etching process of the wafer 100 using the etching device 30, the wafer 100 is externally loaded to the inside of the processing chamber 31, and placed on the wafer stage 32 as the sample stand.

The etching device 30 includes the wafer stage 32 disposed in the processing chamber 31, and the gas supply unit 33 provided with gas cylinders and valves. The gas supply unit 33 allows supply of process gas selected from those of multiple types (34, 35, 36, 37) into the processing chamber 31. Based on a control signal 54 from the device control device 42, the gas supply unit 33 supplies the process gas including protective film forming gas 34, 35, protective film removing gas 36, and etching gas 37 into the processing chamber 31 in accordance with the process step.

The process gas supplied to the processing chamber 31 is decomposed into plasma in the processing chamber 31 by radio frequency power 52 applied from the radio frequency power supply 63 to the radio frequency application unit 41, and bias voltage 53 applied from the bias power supply 40 to the wafer stage 32 under the control of the device control device 42. The inner pressure of the processing chamber 31 can be kept constant in the state where the process gas at the desired flow rate is fed by not shown variable conductance valve and vacuum pumps, which are connected to the processing chamber 31. Each of the radio frequency power supply 63, the radio frequency application unit 41, and the radio frequency power 52 may be considered as a plasma generating unit.

The optical system 38 is configured to evaluate a deposited state of the protective film formed on the wafer 100. The optical spectrum emitted from the optical system 38, and reflected by the wafer 100 is acquired or monitored by the optical system 38. This makes it possible to evaluate the selective deposition of the protective film on the desired material of the pattern formed on the wafer, and the protective film thickness.

Reference data (reference spectrum) are acquired for determining selective deposition of the protective film only on the desired material. For acquiring the reference data, the wafer 100 having the reference pattern formed by selectively depositing the protective film on the desired material of the pattern is loaded into the processing chamber 31, and then placed on the wafer stage 32. The information data on the shape, the thickness, and selectivity of the protective film of the wafer 100 having the reference pattern formed thereon are preliminarily stored in the database 49, and the storage unit 50 of the device control device 42 as wafer information.

In the optical system 38, incident light 57 from a light source 56 is emitted onto a reference groove pattern (reference pattern) on the wafer 100. The light source 56 which emits the light with wavelength ranging from 190 nm to 900 nm is utilized. The reflecting light (interference light) 58 reflected by the reference pattern is detected by a detector 59, dispersed by a spectrometer 61 through an optical fiber 60, and then transmitted to the optical system control device 39 as the reflection spectrum. The reflection spectrum information transmitted to the optical system control device 39 is transmitted to the deposition process control device 47 as the reference data (reference spectrum), and preliminarily stored in the database 49.

An explanation will be made with respect to the plasma etching method according to the example. As FIG. 4 illustrates, in the state where the area 107 with dense patterns 102 coexists with an area 108 with no pattern 102, the protective film 101 is selectively formed on each material of the patterns 102 in the processing chamber 31. The etching process is then applied to an etching object material at high selectivity ratio.

Figure 5:
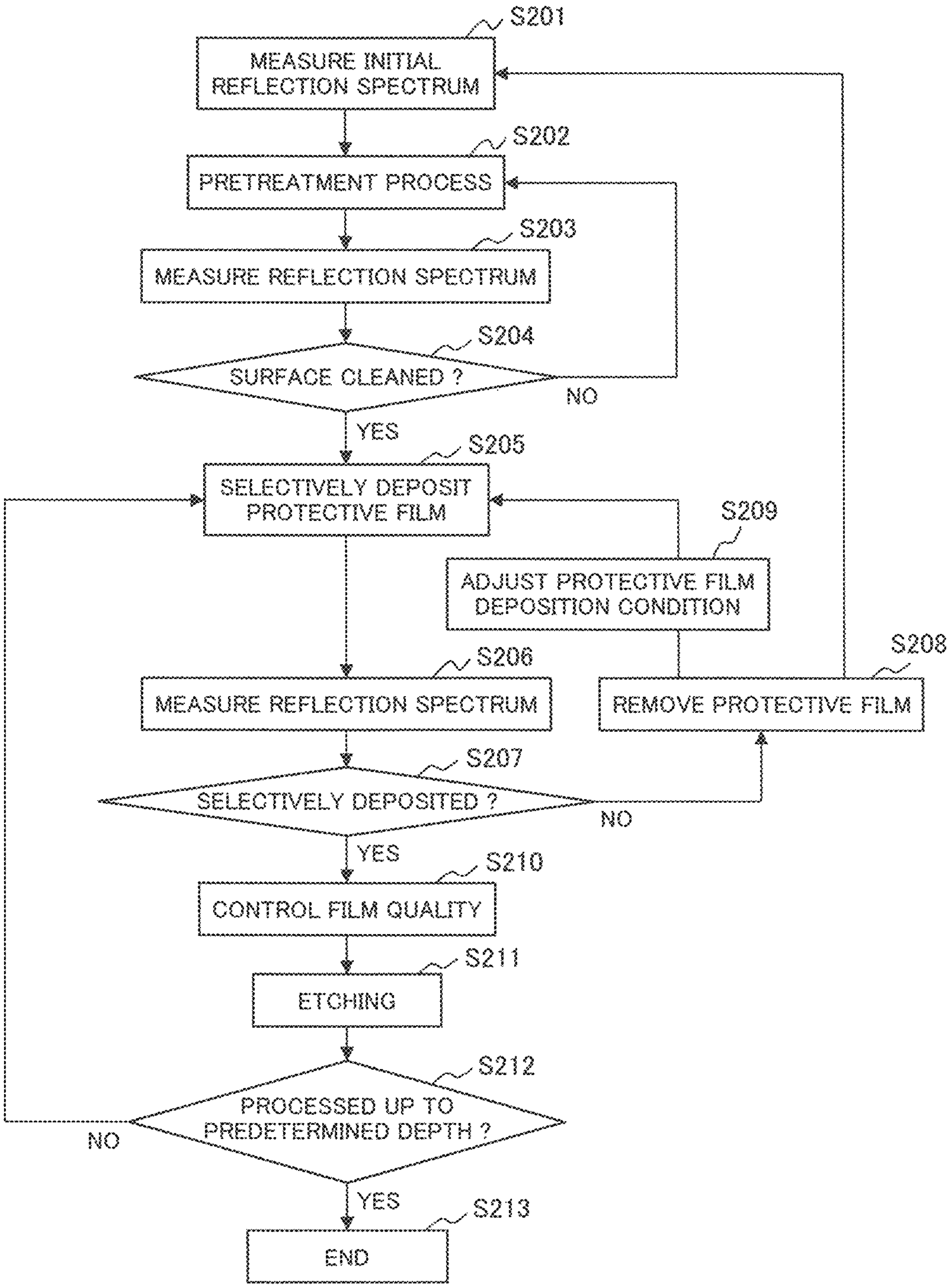
FIG. 5 is an exemplary process flow of a protective film forming method according to an example.
Figure 6:
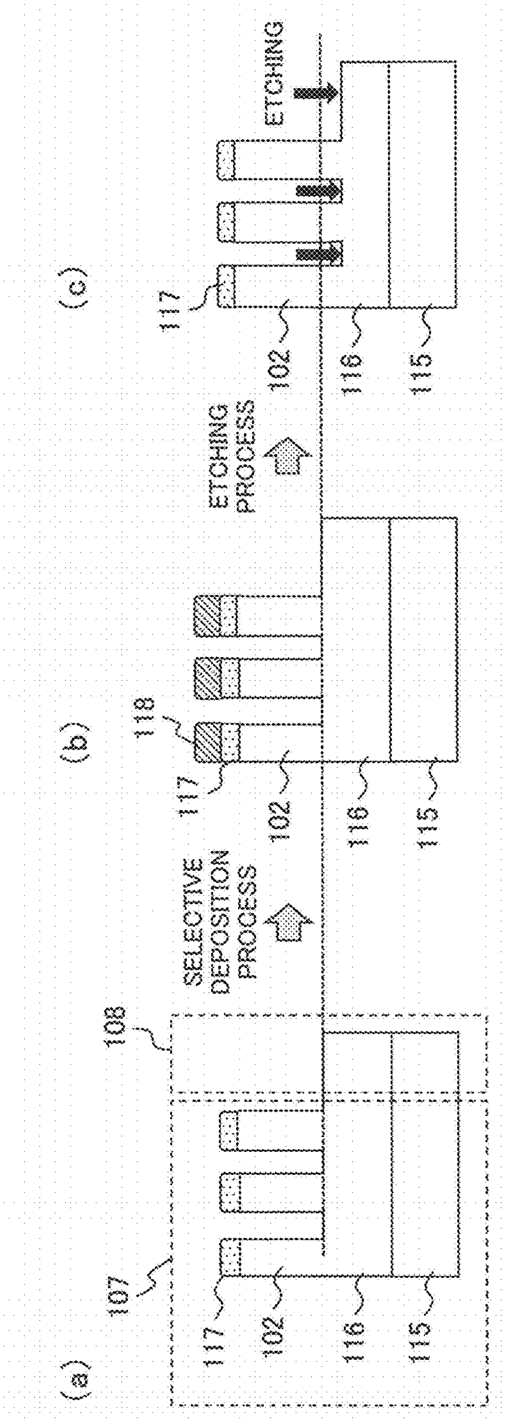
FIG. 6 is a sectional view of patterns indicating an exemplary process flow of the protective film forming method according to an example.

An explanation will be made with respect to the plasma processing method according to the example referring to the drawings. FIG. 5 is an exemplary process flow of the selective protective film forming method according to the example. FIG. 6 is a sectional view of patterns, indicating an exemplary process flow of the protective film forming method according to the example. FIG. 6(*a*) is a sectional view of the pattern having the area 107 with dense patterns 102 coexisting with the area 108 with no pattern 102. FIG. 6(*b*) is a sectional view of the pattern formed by executing the selective protective film deposition process to the pattern as illustrated in FIG. 6(*a*) so that a protective film 118 is selectively deposited. FIG. 6(*c*) is a sectional view of the pattern formed by executing the etching process to the pattern as illustrated in FIG. 6(*b*) so that an etching object pattern 116 is etched at high selectivity ratio.

In the example, the pattern having the area 107 with dense patterns 102 coexisting with the area 108 with no pattern 102 as illustrated in FIG. 6(*a*) is subjected to the process of selectively (partially) depositing the protective film 118 on the material of the mask 117 of the pattern in the dense-pattern area 107 as illustrated in FIG. 6(*b*) without forming the unnecessary protective film on the area 108 with no pattern 102. Referring to FIG. 6(*c*), the etching process is executed to the etching object pattern (etching object film) 116 formed or applied on the substrate 115 at high selectivity ratio while suppressing execution of the etching process to the mask 117. This method will be described based on the flow in FIG. 5.

In the example, there is provided means for determining selectivity in the protective film deposition process by acquiring the reflecting light spectrum for determining selectivity in the protective film deposition process.

Intensity of the reflection spectrum fluctuates depending on outputs of the light source 56 and aging of the optical system 38. In the case of using a light transmitting window made of quartz or the like upon loading of light emitted from the light source 56 to the processing chamber 31, the plasma or the like generated in the processing chamber 31 changes the surface condition of the window 62. This may influence the spectrum of the incident light 57 and the reflecting light (interference light) 58. In order to calibrate the fluctuation, the initial reflection spectrum is measured and acquired as the reference before executing the plasma process (reflection spectrum measurement: S201). An initial wafer as the reference is loaded into the processing chamber 31. The incident light 57 emitted from the light source 56 is introduced into the processing chamber 31 through the light transmitting window 62 for irradiating the wafer. The reflecting light (interference light) 58 transmits through the window 62 again, and is detected by the detector 59. The light detected by the detector 59 is dispersed by the spectrometer 61 via the optical fiber 60. The reflection spectrum dispersed by the spectrometer 61 is stored in the storage unit 50 as the initial spectrum (initial reflection spectrum).

A pretreatment process for cleaning the surface of the wafer 100 as the sample is executed. The pretreatment process is executed to the pattern formed on the wafer 100 to be etched to remove a natural oxide film and the like formed on the pattern surface so that the clean pattern surface is prepared (pretreatment process: S202). The pretreatment process (S202) for preparing the clean surface is executed using the method for etching only the uppermost surface through plasma processing, the method of introducing only gas into the processing chamber 31 without forming plasma, or the method of executing heat treatment.

After forming the clean pattern surface, the incident light 57 from the light source 56 is emitted onto the pattern having the initial reflection spectrum acquired to measure the spectrum of the reflecting light 58 which has been reflected (reflection spectrum measurement: S203). The acquired reflection spectrum is stored in the storage unit 50 as well as the initial spectrum. The acquired reflection spectrum is compared with the reflection spectrum of the cleaned pattern preliminarily stored in the database 49 to confirm whether the surface has been cleaned (S204). If it is determined that the pattern surface has not been cleaned (No), the pretreatment process (S202) and the reflection spectrum measurement (S203) will be executed again.

If the surface of the wafer 100 to be etched has been cleaned (S204: Yes), execution of the process for selectively depositing the protective film to the pattern material (desired material) (selective protective film deposition process) is started (S205).

Based on the control signal 54 from the device control device 42, the protective film forming gas 34, 35 is supplied to the processing chamber 31 each at the predetermined flow rate. Each of the supplied protective film forming gas 34, 35 is formed into plasma by the radio frequency power 52 applied by the radio frequency application unit 41, and decomposed into radicals, ions, or the like. The inner pressure of the processing chamber 31 for the period can be kept constant while having the process gas at the predetermined flow rate fed by the variable conductance valve and vacuum pumps. The radicals and ions generated by plasma reach the surface of the wafer 100 to form the protective film 118 as illustrated in FIG. 6(*b*). When the protective film forming gas 34 is brought into plasma, the radicals and ions which are likely to be deposited on the pattern surface are generated so that the resultant protective film 118 is formed and deposited. When the protective film forming gas 35 is brought into plasma, radicals and ions which exhibits characteristic of removing the deposited content of the protective film 118 are generated to suppress deposition of unnecessary protective film 118 on the wide area with no pattern. The protective film forming gas 34 is the process gas which is highly effective for deposition. The protective film forming gas 35 is the process gas which is effective for removing deposits.

For example, such material as $SiO_2$, Si, SiHx, SiN, SiOC, C, fluorocarbon-based polymer, BCl, BN, BO, and BC can be used as the material for forming the protective film 118 to be deposited.

An explanation will be made with respect to an exemplary case where the Si-based protective film 118 is formed on the mask 117 in the dense pattern 107, and is not formed on the wide area 108. Specifically, the selective protective film deposition process is executed by forming the protective film 118 only on the oxide film ($SiO_2$) as the desired material (117) without forming the protective film 118 on the material Si. In the case where the mask 117 is made of $SiO_2$, and the area 108 having its surface with no protective film is made of Si, the protective film 118 is formed only on the mask 117, and not unnecessarily formed on the wide area 108. In the exemplary case, mixture gas of silicon tetrachloride gas ($SiCl_4$) and hydrogen bromide gas (HBr) as the protective film forming gas 34, and chlorine gas ($Cl_2$) as the protective film forming gas 35 are supplied to the processing chamber 31 each at the predetermined flow rate.

Figure 7A:
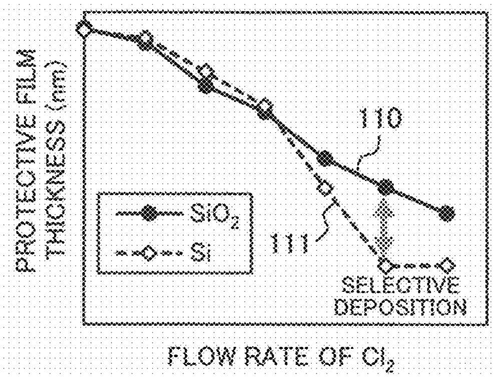
FIGS. 7A and 7B are explanatory views representing an example of selective formation of the protective film on $SiO_2$.
Figure 7B:
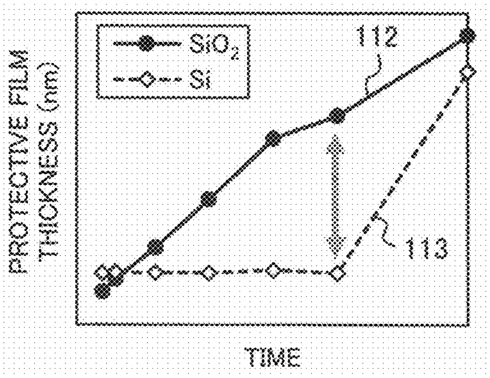

FIG. 7A indicates an example of each change in the film thickness of the protective film 118 (protective film thickness) with respect to the $Cl_2$ flow rate. In this case, the protective film 118 is formed by adding $Cl_2$ to the mixture gas of $SiCl_4$ and HBr, and applied onto materials of Si and $SiO_2$, respectively. A line 110 indicates a change in the protective film thickness on the $SiO_2$ with respect to the $Cl_2$ flow rate. A line 111 denotes a change in the protective film thickness on the Si with respect to the $Cl_2$ flow rate. The following conditional results have been found out. That is, if the $Cl_2$ flow rate is low, there is no difference in the thickness of the protective film 118 formed on the materials between Si and $SiO_2$. As the $Cl_2$ flow rate is increased to a fixed value or larger, the protective film 118 is formed only on the $SiO_2$, and is not formed on the Si. It is found out that the protective film 118 can be selectively deposited on the $SiO_2$. FIG. 7B indicates that the protective film thickness depends on the processing time in the deposition process under the condition where the protective film 118 is formed only on the $SiO_2$, and not formed on the Si. A line 112 denotes a change in the protective film thickness on the $SiO_2$ with respect to the processing time. A line 113 denotes a change in the protective film thickness on the Si with respect to the processing time. If the processing time reaches the fixed time or longer, the protective film 118 will be formed on both the $SiO_2$ and Si. If the processing time is kept at the fixed time or shorter, the protective film 118 is formed only on the $SiO_2$. This clearly shows that the protective film 118 can be selectively formed on the material.

Alternatively, in the case of depositing the film which contains Si or $SiO_2$ as the protective film 118, the gas which is likely to be deposited on the pattern material will be used as the protective film forming gas, for example, $SiCl_4$, or Si-based bas like $SiF_4$ and $SiH_4$. In the case of depositing $SiO_2$ as the protective film 118, $SiF_4$ or the Si-based gas like $SiCl_4$, such gas as $O_2$, $CO_2$, $N_2$, and mixture gas of Ar, He will be used. In the case of depositing Si as the protective film 118, $SiH_4$, $SiF_4$ or the Si-based gas like $SiCl_4$, such gas as $H_2$, HBr, $NH_3$, $CH_3F$, and mixture gas of Ar, He will be used. In the case of depositing SiN as the protective film 118, $SiF_4$ or the Si-based gas like $SiCl_4$, such gas as $N_2$, $NF_3$, and mixture gas of $H_2$, Ar, He will be used. As the protective film forming gas 35, the gas which can remove the deposited film containing Si will be used, for example, $Cl_2$ or fluorocarbon gas like $CF_4$, hydrofluorocarbon gas like $CHF_3$, such gas as $NF_3$, and mixture gas of Ar, He, $O_2$, $CO_2$.

In the case of depositing C-based polymer or CF-based polymer as the protective film 118, fluorocarbon gas, hydrofluorocarbon gas, or noble gas mixture of $CH_4$, Ar, He, Ne, Kr, Xe, and the like will be used as the protective film forming gas 34. As the protective film forming gas mixture gas of $O_2$, $CO_2$, $SO_2$, $CF_4$, $N_2$, $H_2$, anhydrous HF, $CH_4$, $CHF_3$, HBr, $NF_3$, SF 6, and the like will be used.

In the case of depositing BCl, BN, BO, BC, and the like as the protective film 118, noble gas mixture of $BCl_3$, and Ar, He, Ne, Kr, Xe will be used as the protective film forming gas 34. As the protective film forming gas 35, mixture gas of $Cl_2$, $O_2$, $CO_2$, $CF_4$, $N_2$, $H_2$, anhydrous HF, $CH_4$, $CHF_3$, HBr, $NF_3$, $SF_6$, and the like will be used.

The protective film 118 can be selectively deposited in accordance with materials of the non-etching layer 117 of the mask, and the etching object layer 116 as the lower layer.

After execution of the protective film deposition process (S205), the incident light 57 from the light source 56 is emitted onto the pattern again to measure the reflection spectrum of the reflecting light 58 (reflection spectrum measurement: S206). The acquired reflection spectrum is stored in the storage unit 50 as well as the initial spectrum, and transmitted to the determination unit 48 in the deposition process control device 47. The acquired reflection spectrum is compared with the reflection spectrum from the reference pattern on which the protective film 118 is selectively deposited, which has been preliminarily stored in the database 49. Based on the comparison result, it is determined whether the protective film 118 has been selectively deposited (S207). The determination unit 48 is capable of calculating the thickness and the pattern width (dimension) of the selectively deposited protective film 118 using the reflection spectrum from the reference pattern preliminarily stored in the database 49, and the reflection spectrum acquired after depositing the protective film.

Figure 8:
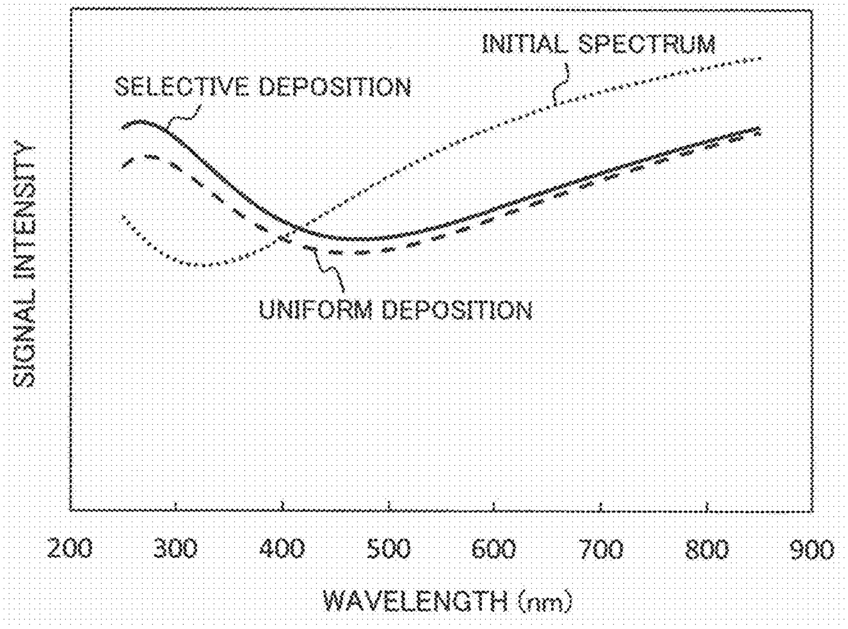
FIG. 8 is an explanatory view representing an example of a method of determining selective formation of the protective film according to an example.

FIG. 8 represents an example of difference in the reflection spectrum between selective deposition of the $SiO_2$-based protective film 118 and the uniform deposition. Y-axis denotes the signal intensity, and X-axis denotes the wavelength. The reflection spectrum varies depending on whether the protection film 118 is deposited selectively or uniformly. The reflection spectrum acquired in the reflection spectrum measurement (S206) after execution of the selective protective film deposition process (S205) is compared with the reflection spectrum preliminarily acquired and stored in the database 49. This makes it possible to determine the selective deposition of the protective film 118. Alternatively, the acquired reflection spectrum is compared with the one calculated using the preliminarily measured reflectance of the protective film 118. This also makes it possible to determine the selective deposition of the protective film 118.

Figure 9:
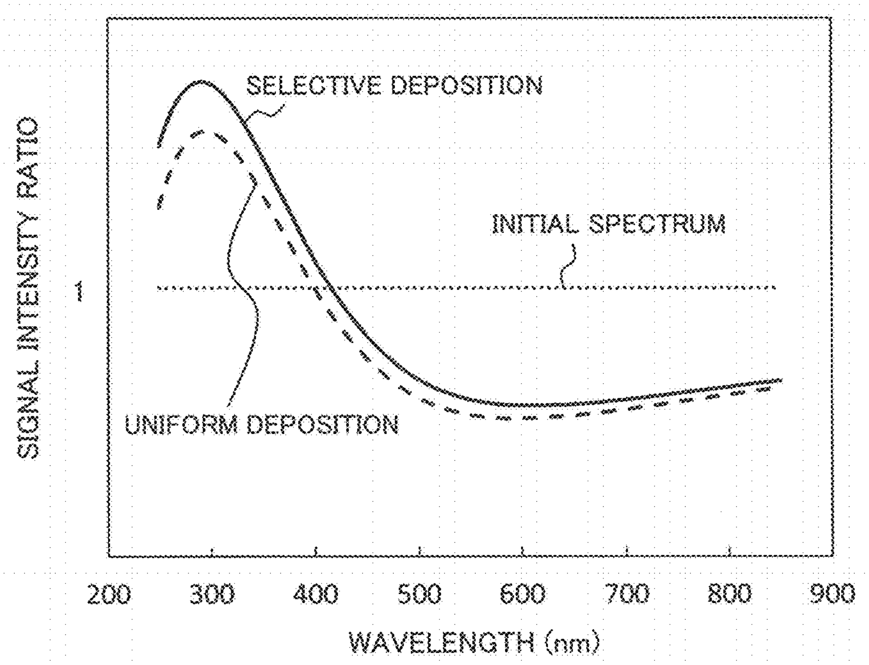
FIG. 9 is an explanatory view representing an example of a method of determining selective formation of the protective film according to an example.

In another method for determining the selective deposition of the protective film 118, it is possible to use the spectrum standardized by the initial spectrum acquired in the initial reflection spectrum measurement (S201), which has been preliminarily stored in the storage unit 50 before execution of the selective protective film deposition process (S205), or by the reflection spectrum with cleaned pattern, which has been acquired in the reflection spectrum measurement (S203) after execution of the pretreatment process (S202) in place of the reflection spectrum acquired in the reflection spectrum measurement (S206) after execution of the selective protective film deposition process (S205). It is possible to make accurate determination by lessening the influence of the spectrum fluctuation on the incident light 57 and the reflecting light (interference light) 58 as a result of change in the surface condition of the window 62 owing to plasma generated in the processing chamber 31. FIG. 9 represents the respective spectrums standardized by the initial spectrum acquired in the initial reflection spectrum measurement (S201) before executing the selective protective film deposition process (S205) in the cases of the selective deposition of the protective film 118 and the uniform deposition of the protective film 118. Y-axis denotes the signal intensity ratio, and X-axis denotes the wavelength. If the $SiO_2$-based protective film 118 is deposited, the difference in the signal intensity between the selective deposition and the uniform deposition tends to become large in the wavelength ranging from 200 to 500 nm. The reflecting light 58 is acquired using the incident light 57 with short wavelength from 200 to 500 nm to determine that the $SiO_2$-based protective film 118 has been selectively deposited with good sensitivity successfully. For example, it is possible to use the ultraviolet light source which emits ultraviolet radiation (or ultraviolet rays), for example, Xe lamp or the like as the light source 56 of the incident light 57 with short wavelength ranging from 200 to 500 nm.

Figure 10:
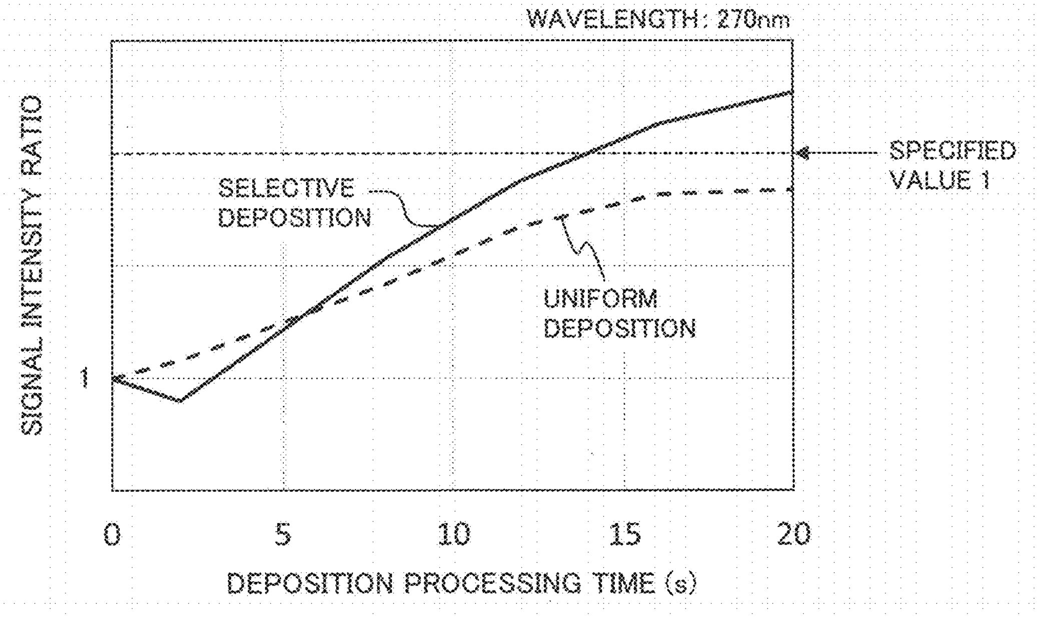
FIG. 10 is an explanatory view representing an example of a method of determining selective formation of the protective film according to an example.

FIG. 10 represents the change in the signal intensity with specific wavelength of 270 nm with respect to the deposition processing time in the cases of the selective deposition and uniform deposition of the $SiO_2$-based protective film 118. Y-axis denotes the signal intensity ratio, and X-axis denotes the deposition processing time. The signal intensity ratio is the value standardized by the signal intensity of the initial spectrum. For example, assuming that the protective film 118 is formed in the processing time of 20 seconds, the specified value 1 is set for determining the selective formation of the protective film 118. If the actually measured signal intensity ratio is larger than (equal to or larger than) the specified value 1, it can be determined that the protective film 118 has been selectively deposited. As illustrated in FIG. 10, the specified value 1 is set to be in the range between the signal intensity ratio derived from the uniform deposition of the protective film 118 and the signal intensity ratio derived from the selective deposition of the protective film 118 in seconds as the processing time. Assuming that the specified value 1 is set to the value 3 as the signal intensity ratio for example, if the actually measured signal intensity ratio is larger than the specified value 1, it can be determined that the protective film 118 has been selectively deposited.

Figure 11:
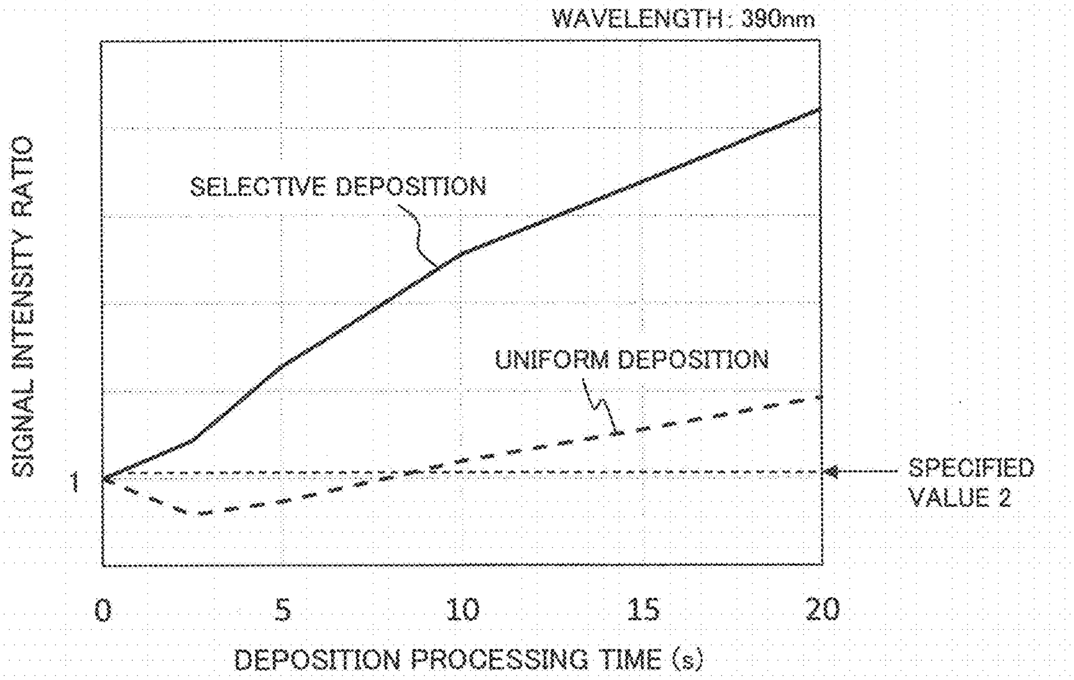
FIG. 11 is an explanatory view representing another example of a method of determining selective formation of the protective film according to an example.

FIG. 11 represents another example, that is, the change in the signal intensity with specific wavelength of 390 nm with respect to the deposition processing time in the cases of the selective deposition and uniform deposition of the $SiO_2$-based protective film 118. Y-axis denotes the signal intensity ratio, and X-axis denotes the deposition processing time. The signal intensity ratio is the value standardized by the signal intensity of the initial spectrum. For example, assuming that the protective film 118 is formed in 5 seconds as the processing time, and a specified value 2 is set to the signal intensity ratio 1, if the actually measured signal intensity ratio is larger than (equal to or larger than) the specified value 2, it can be determined that the protective film 118 has been selectively deposited.

Figure 12:
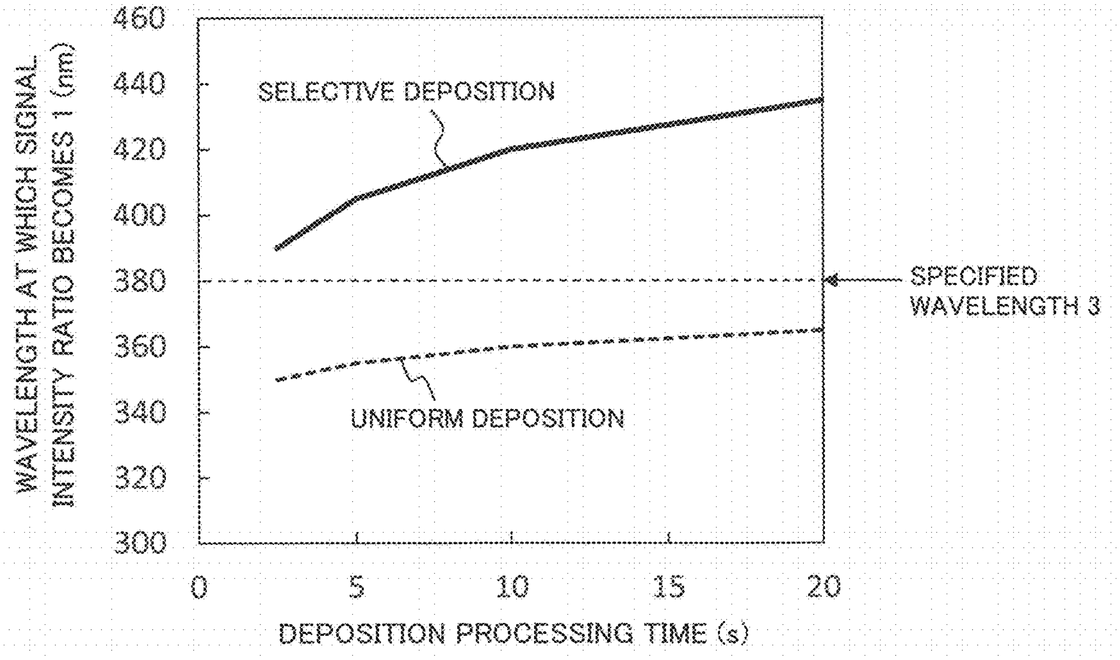
FIG. 12 is an explanatory view representing another example of a method of determining selective formation of the protective film according to an example.

FIG. 12 represents another example, that is, the change in the wavelength at which the signal intensity ratio standardized by the initial spectrum becomes 1 with respect to the deposition processing time in the cases of the selective deposition and uniform deposition of the $SiO_2$-based protective film 118. Y-axis denotes the wavelength at which the signal intensity ratio becomes 1, and X-axis denotes the deposition processing time. Assuming that the protective film 118 is formed in the processing time of 20 seconds, and a specified wavelength 3 is set to 380 nm, if the wavelength at which the signal intensity ratio becomes 1 is longer than the specified wavelength 3, it can be determined that the protective film 118 has been selectively deposited.

The determination unit 48 is allowed to set the specified values 1, 2, and the specified wavelength 3 using the initial spectrum from the reference patterns of the selectively deposited protective film 118, which have been preliminarily stored in the database 49, and the reflection spectrum. Alternatively, the determination unit 48 is allowed to calculate the initial spectrum and the reflection spectrum using optical constants of the preliminarily measured patterns, and optical constants of the deposited films so that the specified values can be preliminarily set.

In the method implemented as described above, if it is determined that the protective film 118 has not been selectively formed in S207 (No), the protective film removing process is executed (S208). Upon start of the protective film removing process (S208), the protective film removing gas 36 at the given flow rate is supplied to the processing chamber 31. The radio frequency power 52 applied to the radio frequency application unit 41 serves to bring the supplied protective film removing gas 36 into plasma. The plasma is decomposed into ions and radicals to be emitted onto the surface of the wafer 100.

After execution of the protective film removing process (S208), the initial spectrum as the reference is acquired again (S201), and the pretreatment process is executed (S202). Thereafter, the selective protective film deposition process is executed again (S205). Conditions for the selective protective film deposition process to be executed again are adjusted to those corrected by the determination unit 48 based on measurement results of the reflection spectrum obtained subsequent to the previously executed protective film deposition process (S205), which have been stored in the storage unit 50 (adjustment of protective film deposition condition: S209). If it is determined for example that the protective film 118 has not been selectively formed based on the reflection spectrum subsequent to the previously executed protective film deposition process, the protective film deposition condition is determined by increasing the flow rate of $Cl_2$ as the protective film forming gas 35 by a given amount. The protective film deposition process is then executed under the adjusted condition (S205).

If it is determined that the protective film 118 has been selectively deposited after execution of the above-described process (Yes in S207), the film quality control process of the protective film 118 is executed (S210). In the film quality control process (S210), film quality of the selectively deposited protective film 118 is modified. Assuming that the Si-based protective film as the protective film 118 is formed in the protective film deposition process (S205), and Si is etched in the next etching process (S111), in some cases, oxidation of the protective film 118 for modification to $SiO_2$ makes the film etchable into the desired pattern shape. Then in the film quality control process (S210), $O_2$ and the mixture gas containing O such as $CO_2$ will be supplied to the processing chamber 31. Alternatively, if nitridation of the protective film 118 for modification to $Si_3N_4$ makes the film etchable into the desired pattern shape, $N_2$ and the mixture gas containing nitrogen such as $NH_3$ will be supplied to the processing chamber 31. The radio frequency power 52 applied to the radio frequency application unit 41 serves to bring the supplied gas into plasma. The plasma is decomposed into radicals and ions to be emitted onto the surface of the wafer 100.

After execution of the film quality control process of the protective film 118 (S210), the formed protective film 118 and the mask 117 originally formed on the pattern 102 serve as the etching mask so that the etching object material 116 is etched (S211).

In the etching process (S211), the device control device 42 controls the gas supply unit 33 to supply the etching gas 37 to the processing chamber 31 at the given flow rate. In the state where the inner pressure of the processing chamber 31 reaches the predetermined value as a result of supplying etching gas 37, the device control device 42 controls the radio frequency power supply 63 to apply the radio frequency power 52 to the radio frequency application unit 41 so that the etching gas 37 is brought into plasma in the processing chamber 31.

The plasma derived from the etching gas 37 generated in the processing chamber 31 is used for etching the wafer 100 on which the protective film 118 is formed. The film thickness of the protective film 118 is measured by the optical system 38 during the etching process until the pattern on the wafer 100 (etching object material 116) is etched up to a predetermined depth (S212). When the etching processing time or the depth reaches the predetermined value, the etching process is terminated (S213).

If the thickness of the protective film 118 becomes equal to or smaller than the specified value before the etching depth reaches the desired value (No in S212), the process returns to the selective protective film deposition process (S205) to start the deposition process of the protective film 118 again. The protective film 118 is selectively deposited until the film thickness reaches the predetermined value. The process from S205 to S212 is executed repeatedly until the pattern on the wafer 100 (etching object material 116) is etched up to the predetermined depth. When the etching depth reaches the predetermined value in S212 (Yes), execution of the etching process is terminated (S213). After etching the pattern, the protective film 118 deposited on the pattern surface can be removed. It is possible to remove only the protective film 118. The protective film 118 retained on the material of the mask 117 can be removed collectively if the protective film 118 is formed on the material of the mask 117.

The plasma processing to the wafer 100 allows formation of the protective film 118 only on the upper surface of the pattern of the mask 117 without forming the unnecessary protective film 118 on the no-pattern area 108. It is therefore possible to solve the conventional problems of the pattern with shallow depth owing to etched upper surface of the mask 117, and etched upper surface of the mask 117 during etching of the etching object layer 116 as the lower layer so that the desired pattern shape can be formed on the wafer 100.

The explanation has been made with respect to the exemplary method for processing the etching object pattern 116 at high selectivity ratio. Specifically, the mask 117 and the etching object layer 116 as the lower layer are formed each as the etching object pattern. If the dense-pattern area 107 coexists with the no-pattern area 108, the protective film 118 is selectively formed on the material of the mask 117 on the dense-pattern area 107 without forming the unnecessary protective film on the etching object material of the no-pattern area 108 so that etching of the mask 117 is suppressed.

Figure 13:
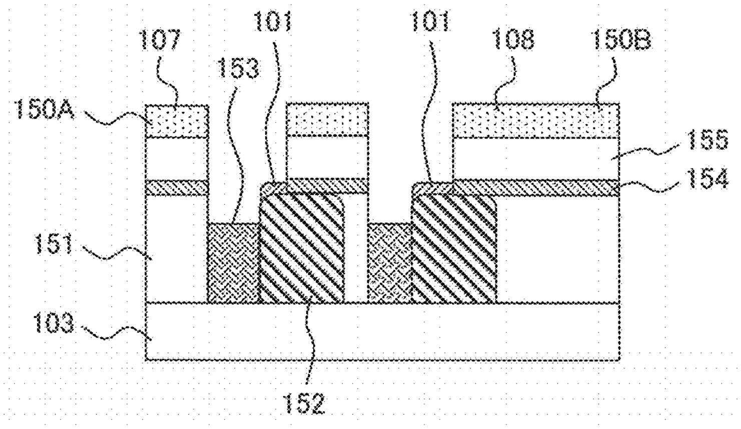
FIG. 13 is an explanatory view representing an example of another pattern to which the present invention is applied.

FIG. 13 illustrates another example of the etchable pattern using the protective film forming method according to the example. Masks 150A, 150B, and an etching object layer 151 as the lower layer are formed as the etching object patterns. A non-etching pattern 152 is formed to partially constitute the etching object layer 151. The mask pattern has the dense-pattern area 107 coexisting with the no-pattern area 108. In the case of etching an etching object material 153 without etching the pattern 152, a protective film 101 can be selectively formed on the material of the pattern 152. If the protective film is not selectively deposited, the thick protective film will be formed both on the no-pattern area 108 on the mask 150B and the area of the mask 150A. The protective film 101 is selectively formed only on the material of the pattern 152 for processing the etching object pattern without depositing the unnecessary protective film on the masks 150A, 150B, and the etching object material 153. Referring to FIG. 13, a reference numeral 154 denotes a stopper layer, and a reference numeral 155 denotes an interlayer insulation film.

Figure 14:
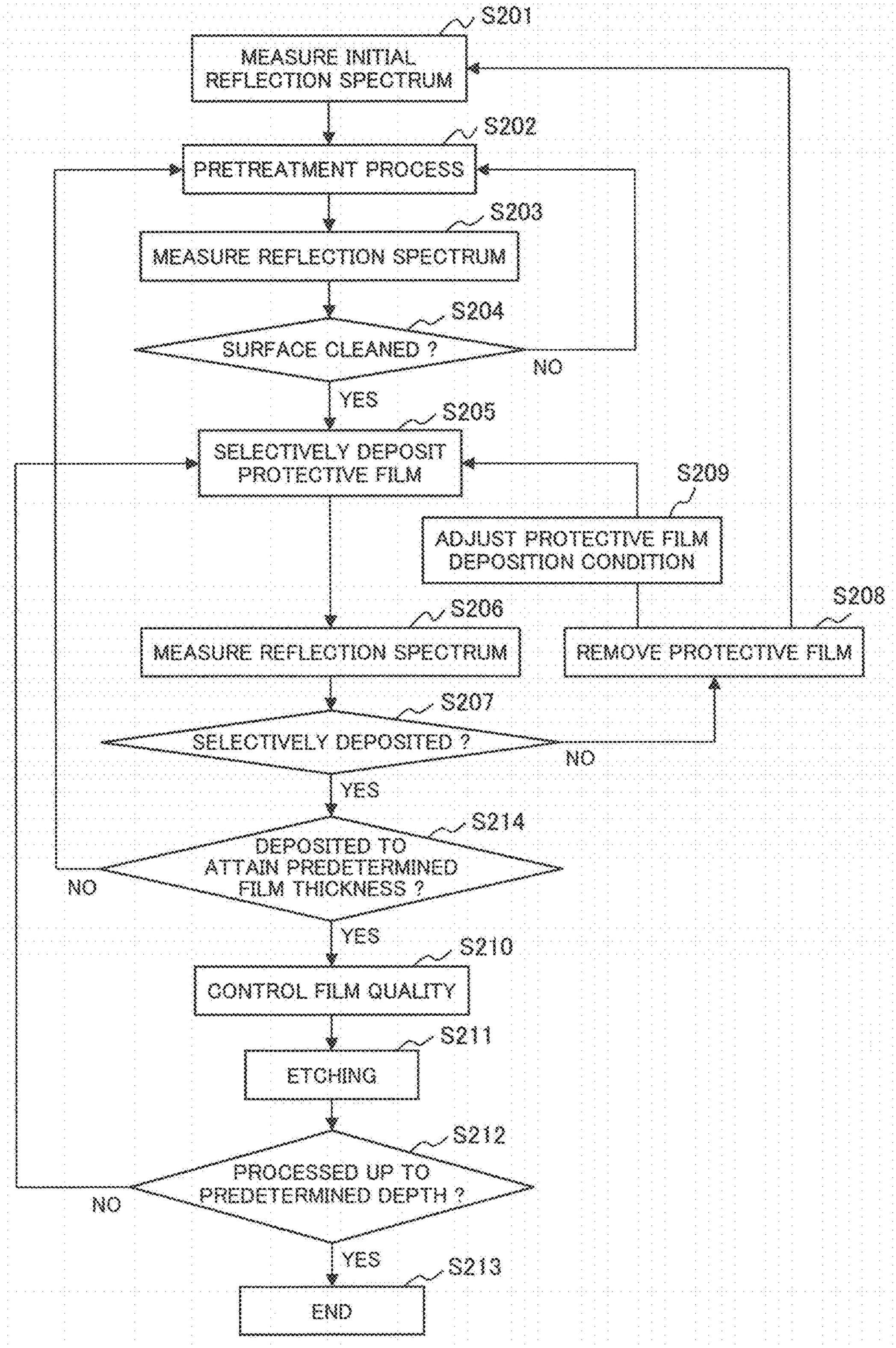
FIG. 14 is an exemplary process flow of a method of cyclic process according to an example.
Figure 15:
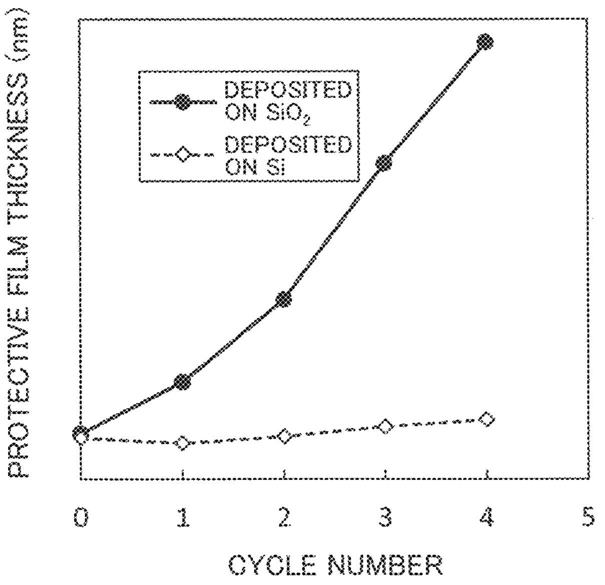
FIG. 15 is an explanatory view representing a method of cyclic process according to an example.

FIG. 14 is an exemplary process flow of a method for selectively forming the protective film on the material. The process flow is implemented by repeatedly executing the selective protective film deposition process (S205) and the pretreatment process (S202) so that the relatively thick protective film is selectively formed. As illustrated in FIG. 7B, the process is executed to prevent loss of selectivity of the material upon execution of the protective film deposition process (S205) for a predetermined period or longer by setting the processing time to maintain the selectivity. After execution of the protective film deposition process (S205), the pretreatment process (S202) is executed again to secure selectivity derived from the material surface in the initial state. After executing the selective protective film deposition process (S205), the reflection spectrum is measured (S206) as described above, and the reflection spectrum is compared with the reflection spectrum from the preliminarily stored reference pattern. It is then determined whether the protective film has been selectively formed (S207). The determination unit 48 calculates the thickness and the pattern width (dimension) of the selectively formed protective film using the reflection spectrum from the reference patterns preliminarily stored in the database 49, and the reflection spectrum acquired after forming the protective film (S214). If the protective film thickness does not reach the fixed film thickness value (No), the pretreatment process is executed again (S202) for cleaning the surface of the material on which the protective film is not formed. Meanwhile, the condition such as the processing time for processing the material on which the protective film has been formed has to be set to prevent the surface from being brought into the initial state irrespective of the pretreatment process. The process from S202 to S214 is repeatedly executed until the protective film has the given thickness so that the thick protective film can be selectively formed. FIG. 15 represents each change in the thickness of the protective films formed on the Si and $SiO_2$ with respect to the repeat count (cycle number). It is confirmed that the method allows formation of the thick protective film only on the $SiO_2$ without forming the protective film on the Si.

The plasma processing device according to the example will be summarized as described below.

The plasma processing device (30) according to the present invention includes the processing chamber (31) having the sample stand (32) on which the patterned sample (100) is placed, the gas supply unit (33) for selecting the process gas from those of multiple types (34, 35, 36, 37), and supplying the selected process gas into the processing chamber (31), the plasma generating units (40, 41, 45, 52) for generating plasma of the process gas supplied into the processing chamber (31) by the gas supply unit (33), the optical system (38) for emitting light onto the sample (100) placed on the sample stand (32), and detecting the spectrum of the interference light from the sample (100), and the control device (42) for controlling the gas supply unit (33), the plasma generating units (40, 41, 45, 52), and the optical system (38).

The control device (42) controls the gas supply unit (33) to supply the protective film forming gas (34, 35) into the processing chamber (31). In this state, the control device controls the plasma generating units (40, 41, 45, 52) to form the protective film (101, 118) on the surface of the sample (100) placed on the sample stand (32). The control device further compares the spectrum of the acquired interference light with the preliminarily acquired reference spectrum to determine the selective formation of the protective film (101, 118) in accordance with the material for forming the pattern (102, 117).

The control device (42) controls the gas supply unit (33) to select the etching gas (37) to be supplied into the processing chamber (31), and in this state, controls the plasma generating units (40, 41, 45, 52) to execute the etching process to the sample (100) with the protective film (101, 118) formed thereon, which is placed on the sample stand (32).

The plasma processing device according to the example may be summarized as described below.

The plasma processing device (30) includes the processing chamber (31) in which the sample (100) is plasma processed, the radio frequency power supply (63) for supplying the radio frequency power to generate plasma, and the sample stand (32) on which the sample (100) is placed. The plasma processing device (30) further includes the control device (42) which irradiates the sample (100) with ultraviolet light to measure the thickness of the protective film (118) selectively formed on the desired material of the sample (100) using the interference light (58) reflecting from the sample (100), or to determine selectivity of the protective film (118) using the interference light (58) reflecting from the sample (100).

The control device (42) measures the thickness of the protective film (118), or determines selectivity of the protective film (118) based on results of comparison between the spectrum of the monitored interference light (58) and the spectrum of the preliminarily acquired interference light (58) in the case where the protective film (118) has been formed.

Preferably, each of the spectrum of the monitored interference light (58) and the spectrum of the preliminarily acquired interference light (58) is standardized by the spectrum (initial spectrum) of the interference light (58) of the sample (100) which has not been plasma processed. If the standardized spectrum value of the monitored interference light (58) is larger than the given value, the control device (42) determines that the protective film (118) has been selectively formed on the desired material (117) of the sample (100).

The plasma processing method according to the example will be summarized as described below.

In the plasma processing method according to the present invention, the means is provided for executing the pretreatment process (S202) to clean the surface of the pattern (102, 117) by removing the natural oxidation film formed on the sample (100) placed on the sample stand (32). In the plasma processing method for etching the sample (100) using plasma, the means is provided for supplying the protective film forming gas (34, 35) into the processing chamber (31) to selectively form the protective film (101, 118) on the material of the pattern (102, 117). The means for selectively forming the protective film (101, 118) on the material of the pattern (102, 117) is implemented by executing the process (S205) and the process (S211) for etching the sample (100). In the process (S205), the plasma generating units (40, 41, 45, 52) generate plasma of the protective film forming gas (34, 35) in the processing chamber (31) to selectively deposit the protective film (101, 108) on the surface of the pattern (102, 117) formed on the sample (100) placed on the sample stand (32). In the process (S211), the plasma generating units (40, 41, 52) generate plasma of the etching process gas (37) supplied into the processing chamber (31)

to form the sample (100) having the protective film (101, 118) formed on the surface of the pattern (102, 117). In the process, the sample (100) is then etched to remove the gap between the groove patterns, and the etching object pattern on the area (108) in the absence of groove pattern.

There is provided means for controlling the process (S205) of selectively depositing the protective film (101, 118) on the surface of the pattern (102, 117), which is implemented by executing the process to be described below. In the process (S207), the sample (100) is irradiated with the light (57) before and after executing of the protective film deposition process (S205) to detect the spectrum of the interference light (58) from the sample (100), and it is determined whether the protective film (101, 118) has been selectively formed by comparison between the detected spectrum and the preliminarily acquired spectrum of the interference light in the case where the protective film (101, 118) has been formed. In the process S208, the means is provided for removing the protection film (101, 118) if the protective film (101, 118) has not been selectively formed. In the process S209, under the adjusted protective film deposition condition, the protective film forming gas (34, 35) for selectively depositing the protective film (101, 118) is supplied into the processing chamber (31) again to allow the plasma generating units (40, 41, 45, 52) to generate plasma of the protective film forming gas (34, in the processing chamber (31). This allows execution of the process (S205) of selectively depositing the protective film (101, 118) on the surface of the pattern (102, 117) of the sample (100) placed on the sample stand (32).

In S212, in order to etch the thick film, and to process the pattern bottom at the high aspect ratio, the process (S205) for selectively depositing the protective film (101, 118) and the process (S211) for etching the etching object film are executed cyclically with repetition (S212).

The plasma processing method according to the example may be summarized as described below.

In the plasma processing method for plasma etching of the etching object film (116) by selectively forming the protective film (101, 108) on the desired material (117), the protective film (116) is selectively formed on the desired material using gaseous silicon tetrachloride ($SiCl_4$), hydrogen bromide gas (HBr), and chlorine gas ($Cl_2$) (S205: selective protective film deposition process). The oxide film ($SiO_2$) is used as the desired material.

In the plasma processing method for plasma etching of the etching object film (116) by selectively forming the protective film (101, 108) on the desired material (117), the sample (100) having the etching object film (116) formed thereon is irradiated with the ultraviolet-ray to measure the thickness of the protective film (101, 108) using the interference light (58) reflecting from the sample (100), or to determine selectivity of the protective film (101, 108) using the interference light (58) reflecting from the sample (100) which has been irradiated with the ultraviolet-ray.

The present invention made by the inventors has been described in detail based on the example. The present invention is not limited to the example as described above, but variously modifiable without departing from the scope of the invention. For example, the example is described in detail for readily understanding of the present invention, which is not necessarily limited to the one equipped with all structures as described above. It is possible to add, remove, and replace the other structure to, from and with a part of the structure of the example.

REFERENCE SIGNS LIST

30 . . . etching device,
31 . . . processing chamber,
32 . . . wafer stage,
33 . . . gas supply unit,
34 . . . protective film forming gas,
35 . . . protective film forming gas,
36 . . . protective film removing gas,
37 . . . etching gas,
38 . . . optical system,
39 . . . optical system control device,
40 . . . bias power supply,
41 . . . radio frequency application unit,
42 . . . device control device,
43 . . . gas control device,
44 . . . exhaust system control device,
45 . . . radio frequency control device,
46 . . . bias control device,
47 . . . deposition process control device,
48 . . . determination unit,
49 . . . database,
50 . . . storage unit,
51 . . . clock,
52 . . . radio frequency power,
54 . . . control signal,
56 . . . light source,
57 . . . incident light,
58 . . . reflecting light,
59 . . . detector,
60 . . . optical fiber,
61 . . . spectrometer,
62 . . . window,
63 . . . radio frequency power supply,
100 . . . wafer,
101 . . . protective film,
102 . . . pattern,
103 . . . substrate,
104 . . . unnecessary protective film,
106 . . . unnecessary protective film,
107 . . . dense-pattern area,
108 . . . no-pattern area,
109 . . . surface of no-pattern area,
115 . . . substrate,
116 . . . etching object pattern,
117 . . . mask,
118 . . . protective film,
110 . . . change in thickness of protective film on $SiO_2$ with respect to $Cl_2$ flow rate,
111 . . . change in thickness of protective film on Si with respect to $Cl_2$ flow rate,
112 . . . change in thickness of protective film on $SiO_2$ with respect to processing time,
113 . . . change in thickness of protective film on Si with respect to processing time,
120 . . . deposited film,
121 . . . upper surface of pattern,
122 . . . side surface

The invention claimed is:

1. A plasma processing apparatus comprising:
a processing chamber in which a sample is plasma processed;
a radio frequency power supply which supplies radio frequency power for generating plasma;
a sample stand on which the sample is placed;
an optical system comprising an incident light source that emits incident ultraviolet-ray light onto a reference groove pattern on the sample, a detector which detects interference light reflected by the sample, and a spectrometer that disperses the interference light through an optical fiber and which transmits a reference spectrum of the interference light; and a control device configured to selectively deposit a protective film by partially depositing the protective film on a desired material of the sample, wherein the partially depositing the protective film is performed for less than a predetermined processing time; and receive the reference spectrum of the interference light transmitted by the spectrometer and (A) measure a thickness of the protective film formed on the desired material of the sample using the reference spectrum of the interference light reflected by the sample which has been irradiated with the ultraviolet-ray light, or (B) to determine selectivity of the protective film using the interference light reflected by the sample which has been irradiated with the ultraviolet-ray light, by determining, for each of (A) or (B), that the interference light reflected by the sample for the selectively-deposited protective film has a signal intensity that exceeds a stored signal intensity for the interference light reflected by the sample for a uniformly-deposited protective filmi by a first specified value for a first wavelength within the processing time, with respect to a case in which the selectively-deposited protective film is uniformly-deposited.

2. The plasma processing apparatus according to claim 1, wherein the control device is further configured to measure the thickness of the protective film or to determine selectivity of the protective film based on a result of comparison between a spectrum of the interference light which has been monitored and a spectrum of the interference light which has been preliminarily acquired upon formation of the protective film.

3. The plasma processing apparatus according to claim 2, wherein the spectrum of the monitored interference light and the spectrum of the preliminarily acquired interference light are standardized by a spectrum of the interference light of the sample which has not been plasma processed.

4. The plasma processing apparatus according to claim 3, wherein if the spectrum of the standardized and monitored interference light takes a value larger than a given value, the control device determines that the protective film has been selectively formed on the desired material of the sample.

5. The plasma processing apparatus according to claim 1, wherein the control device is further configured to determine that the interference light reflected by the sample for the selectively-deposited protective film has a signal intensity that exceeds the stored signal intensity for the interference light reflected by the sample for the uniformly-deposited protective film by a second specified value for a second wavelength within the processing time.

6. The plasma processing apparatus according to claim 5, wherein the control device is further configured to determine that a specified wavelength at which a signal intensity ratio of the signal intensity for the interference light reflected by the sample for the selectively-deposited protective film, and the stored signal intensity for the interference light reflected by the sample for the uniformly-deposited protective film, converges to 1, is longer than the specified wavelength within the processing time.

* * * * *